United States Patent
Chae et al.

(10) Patent No.: US 7,072,238 B2
(45) Date of Patent: Jul. 4, 2006

(54) SEMICONDUCTOR DEVICE CAPABLE OF GENERATING RIPPLE-FREE VOLTAGE INTERNALLY

(75) Inventors: Dong-Hyuk Chae, Seoul (KR); Young-Ho Lim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/025,001

(22) Filed: Dec. 28, 2004

(65) Prior Publication Data
US 2006/0044884 A1 Mar. 2, 2006

(30) Foreign Application Priority Data
Sep. 2, 2004 (KR) .............. 10-2004-0069927

(51) Int. Cl.
*G11C 7/00* (2006.01)
(52) U.S. Cl. ............ 365/226; 365/189.09; 365/189.07; 365/185.21
(58) Field of Classification Search ................ 365/226, 365/189.09, 189.07, 185.21
See application file for complete search history.

(56) References Cited

U.S. PATENT DOCUMENTS

| 5,426,616 A | * | 6/1995 | Kajigaya et al. ............ 365/226 |
| 5,499,209 A | * | 3/1996 | Oowaki et al. ......... 365/189.11 |
| 5,519,656 A |   | 5/1996 | Maccarrone et al. |
| 5,642,309 A |   | 6/1997 | Kim et al. |
| 5,689,460 A | * | 11/1997 | Ooishi ................... 365/189.07 |
| 5,881,014 A | * | 3/1999 | Ooishi ......................... 365/226 |
| 6,031,778 A | * | 2/2000 | Makino et al. ............. 365/226 |
| 6,038,178 A | * | 3/2000 | Oh ........................ 365/189.09 |
| 6,061,270 A |   | 5/2000 | Choi |
| 6,335,881 B1 |   | 1/2002 | Kim et al. |
| 6,370,062 B1 |   | 4/2002 | Choi |

FOREIGN PATENT DOCUMENTS

| JP | 2002-150786 | 5/2002 |
| KR | 2003-0057885 | 7/2003 |

OTHER PUBLICATIONS

English language abstract of Korean Publication No. 2003-0057885.
English language abstract of Japanese Publication No. 2002-150786.

* cited by examiner

*Primary Examiner*—Tuan T. Nguyen
(74) *Attorney, Agent, or Firm*—Marger Johnson & McCollom, P.C.

(57) ABSTRACT

A semiconductor device that generates a regulated high voltage. The device includes, a high voltage generation circuit for supplying a high voltage to the first power line, a current bypass circuit for supplying current to a second power line from the first power line, a PMOS transistor coupled between a first power line and the second power line, and a controller for controlling the drive current of the PMOS transistor in response to the voltage on the second power line.

17 Claims, 6 Drawing Sheets

Fig. 1

(PRIOR ART)

Fig. 2

(PRIOR ART)

SEMICONDUCTOR DEVICE CAPABLE OF GENERATING RIPPLE-FREE VOLTAGE INTERNALLY

PRIORITY CLAIM

This application claims priority of Korean Patent Application No. 2004-69927, filed on Sep. 2, 2004 in the Korean Intellectual Property Office. The entire disclosure of Korean Patent Application No. 2004-69927 is hereby incorporated herein by reference.

BACKGROUND OF THE INVENTION

1. Field of the Invention

The present invention relates to semiconductor integrated circuit devices and, more particularly, to semiconductor integrated circuit devices that include a high voltage generator.

2. Description of Related Art

Semiconductor memories are vital components of a wide array of electronic devices. Semiconductor memory devices can be characterized as volatile memory devices and non-volatile memory devices.

In volatile memory devices, logic information is stored either by setting the logic state of a bistable flip-flop such as is done in a static random access memory (SRAM), or through the charging of a capacitor as is done in a dynamic random access memory (DRAM). In either case, the data is stored and can be read out only while power is applied. The stored data is lost when power is turned off.

Non-volatile memory devices, such as MROM, PROM, EPROM, and EEPROM devices, are capable of storing the data even with power turned off. The non-volatile memory data storage mode may be permanent or reprogrammable depending on the technology used. Non-volatile memories are often used for program and microcode storage in a wide variety of devices.

A combination of single-chip volatile as well as non-volatile memory storage devices is also available in devices such as non-volatile SRAM (nvSRAM) devices. Such devices are generally used in systems that require fast and reprogrammable non-volatile memory. In addition, many special memory architectures have evolved which contain additional logic circuitry to optimize performance for application-specific tasks.

With non volatile semiconductor memory devices, since MROM, PROM, and EPROM devices, it is difficult for users to renew the memory content. To the contrary, EEPROM devices are electrically erasable and readable, thus it is easy to renew the memory content of such devices. Such devices are often used to store system programming that requires continuous renewal. Flash EPROM (hereinafter referred to as "flash memory") devices are suitable for large capacitance subsidiary memory devices because flash memory has higher integration than conventional EEPROM devices. NAND-type flash memories have even higher integration than NOR-type flash memories.

In flash memories, if memory cells are programmed once, the programmed memory cell must be erased in order to store new data. That is, flash memories do not support an overwrite function. Methods for programming and erasing general flash memories are, for example, disclosed in U.S. Pat. No. 6,061,270 entitled "METHOD FOR PROGRAMMING A NON-VOLATILE MEMORY DEVICE WITH PROGRAM DISTURB CONTROL", U.S. Pat. No. 6,335,881 entitled "METHOD FOR PROGRAMMING A FLASH MEMORY DEVICE", and U.S. Pat. No. 6,370,062 entitled "NAND-TYPE FLASH MEMORY DEVICE AND METHOD OF OPERATING THE SAME".

In general, in order to erase or program a memory cell in a non-volatile memory device, higher voltage than the power supply voltage is required. An example of circuitry to generate such a high voltage is disclosed in U.S. Pat. No. 5,642,309 entitled "AUTO-PROGRAM CIRCUIT IN A NON-VOLATILE SEMICONDUCTOR MEMORY DEVICE".

Figure 1:
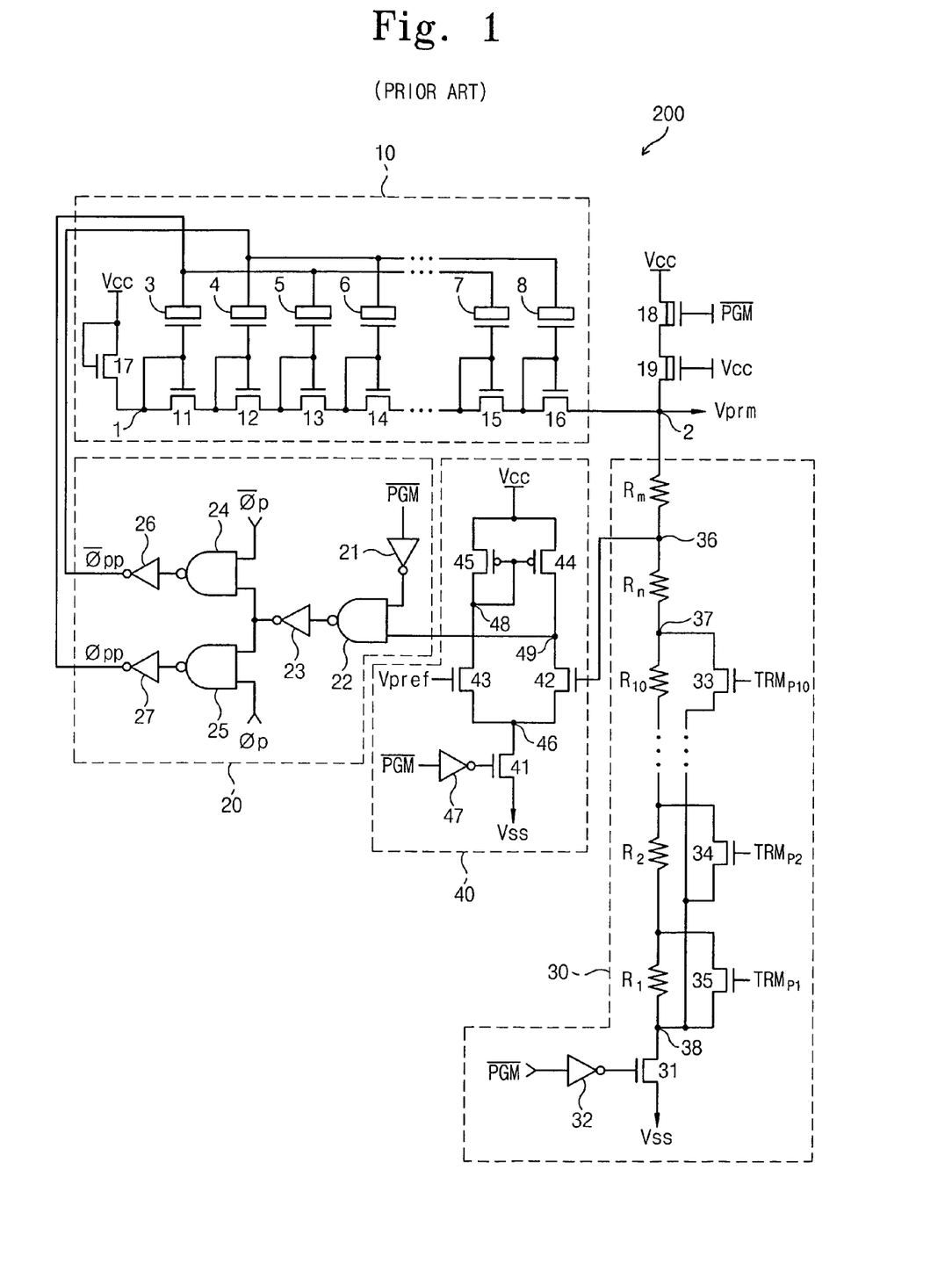
FIG. 1 is a circuit diagram of a prior art high voltage generator circuit.

FIG. 1 herein shows a circuit diagram of conventional high voltage generator circuit such as that shown in U.S. Pat. No. 5,642,309. With the circuit shown in FIG. 1, a program voltage Vpgm generated from a high voltage generator 10 is divided by trimming circuit 30. The divided voltage is compared with a reference voltage Vpref by a comparator circuit 40. A control circuit 20 controls the transmission of clock signals to the high voltage generator 10 based on the output of the comparator. The control circuit 20 generates clock signals ΦPP and /ΦPP which provide inputs to the high voltage generator 10. The high voltage generator 10 is a charge pump. The generator 10 is turned on and off according to the result of the comparison between the divided voltage and the reference voltage.

Figure 2:
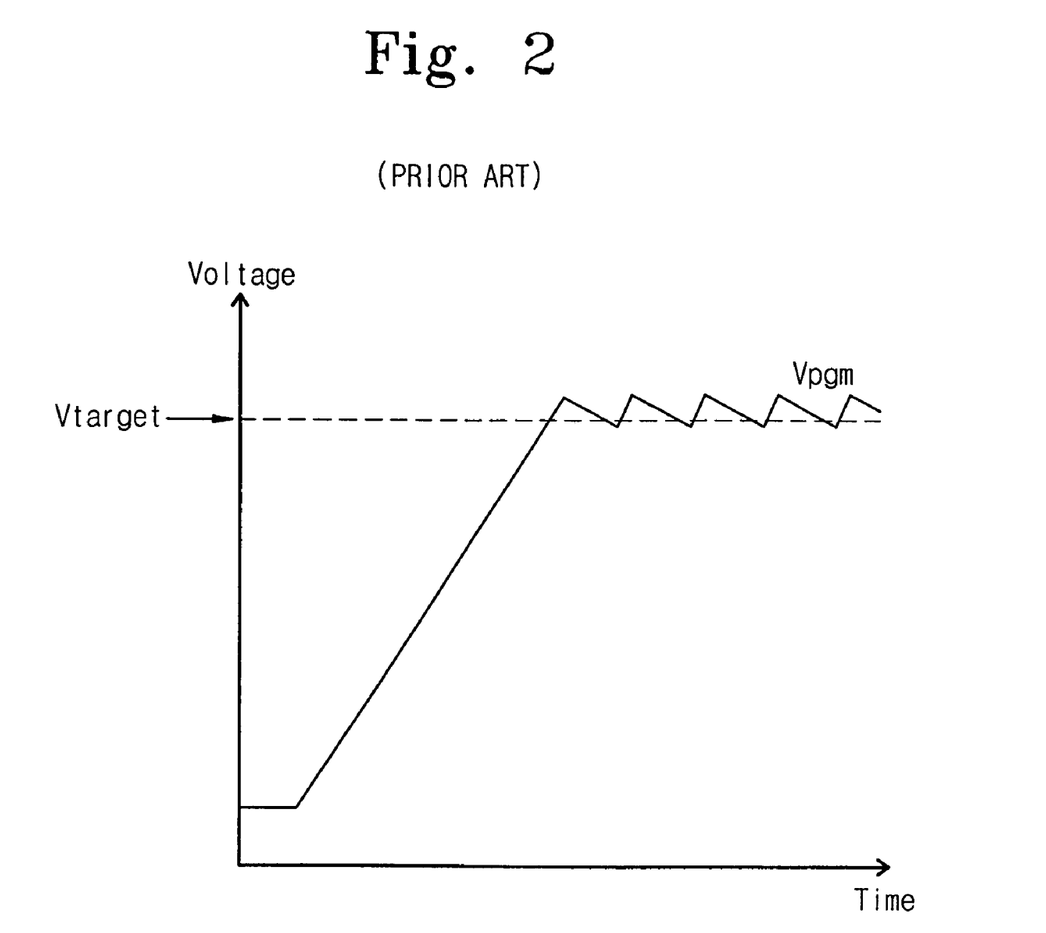
FIG. 2 illustrates a waveform generated by the high voltage generator circuit shown in FIG. 1.

The clock signals ΦPP and ΦPP are generated from the time voltage Vpgm reaches a target level Vtarget, to the time that the charge pump is turned off. This may generate additional or unnecessary clock signals. Due to the additional or unnecessary clock signals ΦPP and /ΦPP, the voltage Vpgm rises to be higher than the target level Vtarget, as illustrated in FIG. 2. As a result, the voltage Vpgm is irregularly maintained, that is, a ripple phenomenon occurs.

SUMMARY OF THE INVENTION

The present invention is directed to a semiconductor device for suppressing ripple in the output of a high voltage generator. In the embodiment of the invention shown herein, a high voltage generator circuit supplies a high voltage to the first power line. A regulator circuit is connected between the first power line and a second power line. The regulator circuit includes a PMOS transistor coupled between the first power line and the second power line, a current bypass circuit connected between the first and second power lines; and a controller for controlling the drive current of the PMOS transistor in response to the voltage on the second power line. The current bypass circuit is cut off when the voltage on the second power line reaches a first target. After the bypass circuit is cut off, current supply to the second power line is conducted through the PMOS transistor until the voltage of the second power line reaches a second target voltage lower than the first target voltage. The circuit produces a voltage on the second power line that does not have ripple.

DETAILED DESCRIPTION

Figure 3:
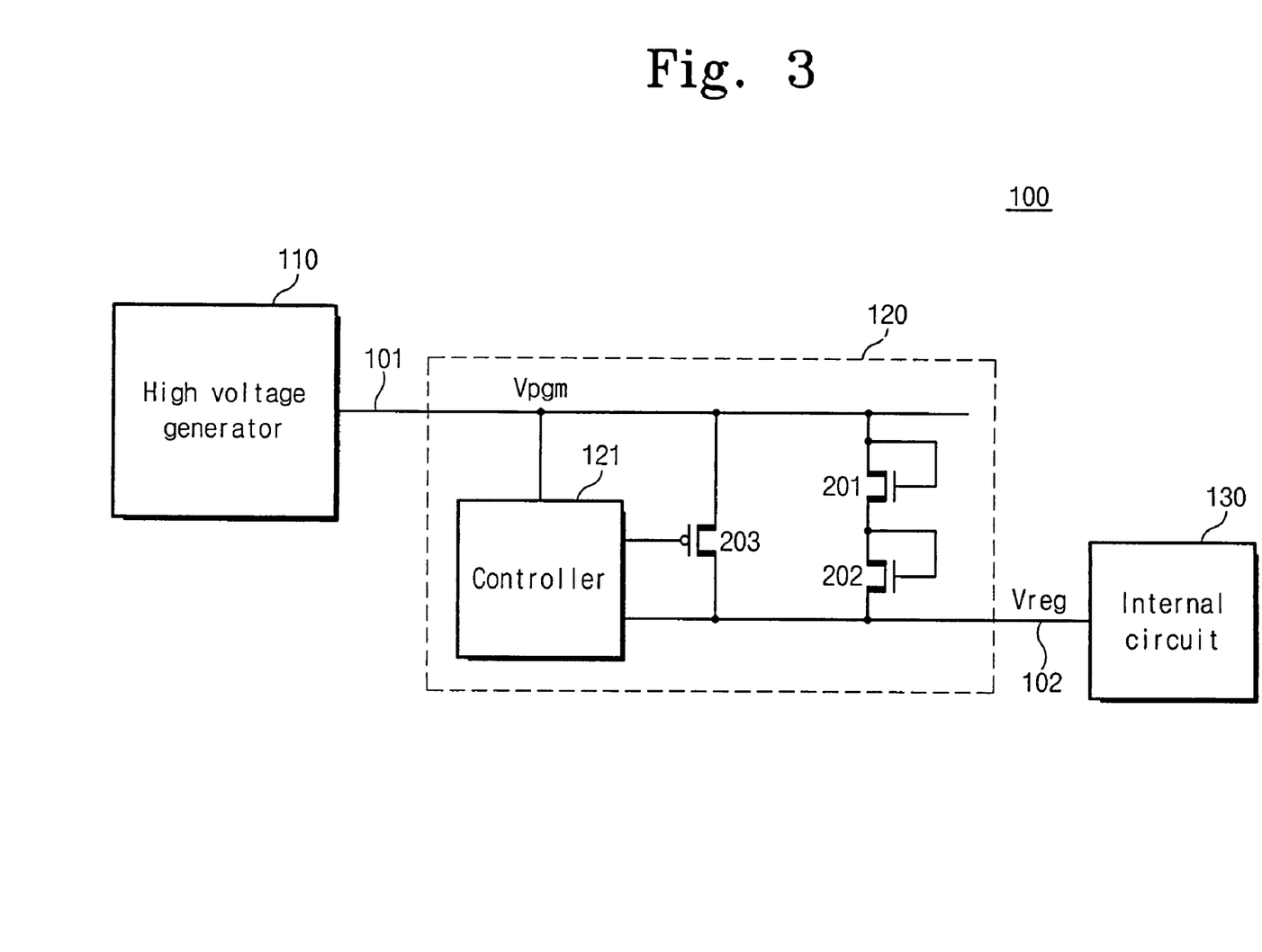
FIG. 3 is a block diagram of a semiconductor device according to a first embodiment of the present invention.

A first preferred embodiment of the present invention is shown in FIG. 3. In the embodiment illustrated in FIG. 3, a semiconductor device 100 includes a high voltage generator circuit 110, a voltage regulator circuit 120, and an internal circuit 130. The high voltage generator circuit 110 is coupled to a power line 101 and it generates a high voltage Vpgm. The voltage regulator circuit 120 is coupled between the power line 101 and the power line 102 and it generates a regulated voltage Vreg. The regulated voltage Vreg is supplied to the internal circuit 130 through the power line 102.

The voltage regulator circuit 120 includes NMOS transistors 201 and 202, a PMOS transistor 203, and a controller 121. The NMOS transistors 201 and 202 are serially coupled between the power lines 101 and 102 and they operate as diodes. When the high voltage Vpgm reaches a desired voltage level, the current path provided by the NMOS transistors 201 and 202 is cut off. This occurs when a voltage of the power line 102 reaches Vregi-2Vth (where Vth: is the threshold voltage of the NMOS transistor).

The PMOS transistor 203 is coupled between the power lines 101 and 102 and it is controlled by the controller 121. The controller 121 is connected to the power lines 101 and 102 and controls a current drivability of the PMOS transistor 203 depending on whether the regulation voltage Vreg reaches a target voltage. That is, after the voltage on the power line 102 reaches Vreg-2Vth, the voltage of the power line 102 is increased to a target voltage through the PMOS transistor 203. This will be described in detail later.

In this embodiment, the high voltage Vpgm is set to be higher voltage than the regulation voltage Vreg. The voltage Vpgm is set so that the voltage difference between the power lines 101 and 102 is smaller than a sum of threshold voltages of the NMOS transistors 201 and 202 (and smaller than a breakdown voltage of the PMOS transistor 203). The NMOS and PMOS transistors 201, 202, and 203 are conventional high voltage transistors which are durable to a high voltage Vpgm.

The NMOS transistors 201 and 202 operate until the power line 102 is charged to a voltage of Vpgm-2Vth (where Vth is the threshold voltage of an NMOS transistor). In other words, the current path through the NMOS transistors 201 and 202 is cut off when the voltage line 102 reaches a voltage of Vpgm-2Vth (where Vth is the threshold voltage of an NMOS transistor). When the current path is cut off, the voltage difference between the power lines 101 and 102 is maximal (Vpgm-2Vth). The regulation voltage Vreg rises quickly as the NMOS transistors 201 and 202 create a current bypass path. After the power line 102 reaches a voltage of Vpgm-2Vth (Vth being the threshold voltage of an NMOS transistor), current is supplied to the power line 102 through the PMOS transistor 203 until the regulation voltage Vreg reaches a target voltage. As the current is supplied to the power line 102 through the PMOS transistor 203, the regulation voltage Vreg slowly rises up to the target voltage. Such regulation enables the regulation voltage Vreg supplied to the internal circuit 130 to be maintained, that is, the ripple phenomenon is suppressed.

Figure 4:
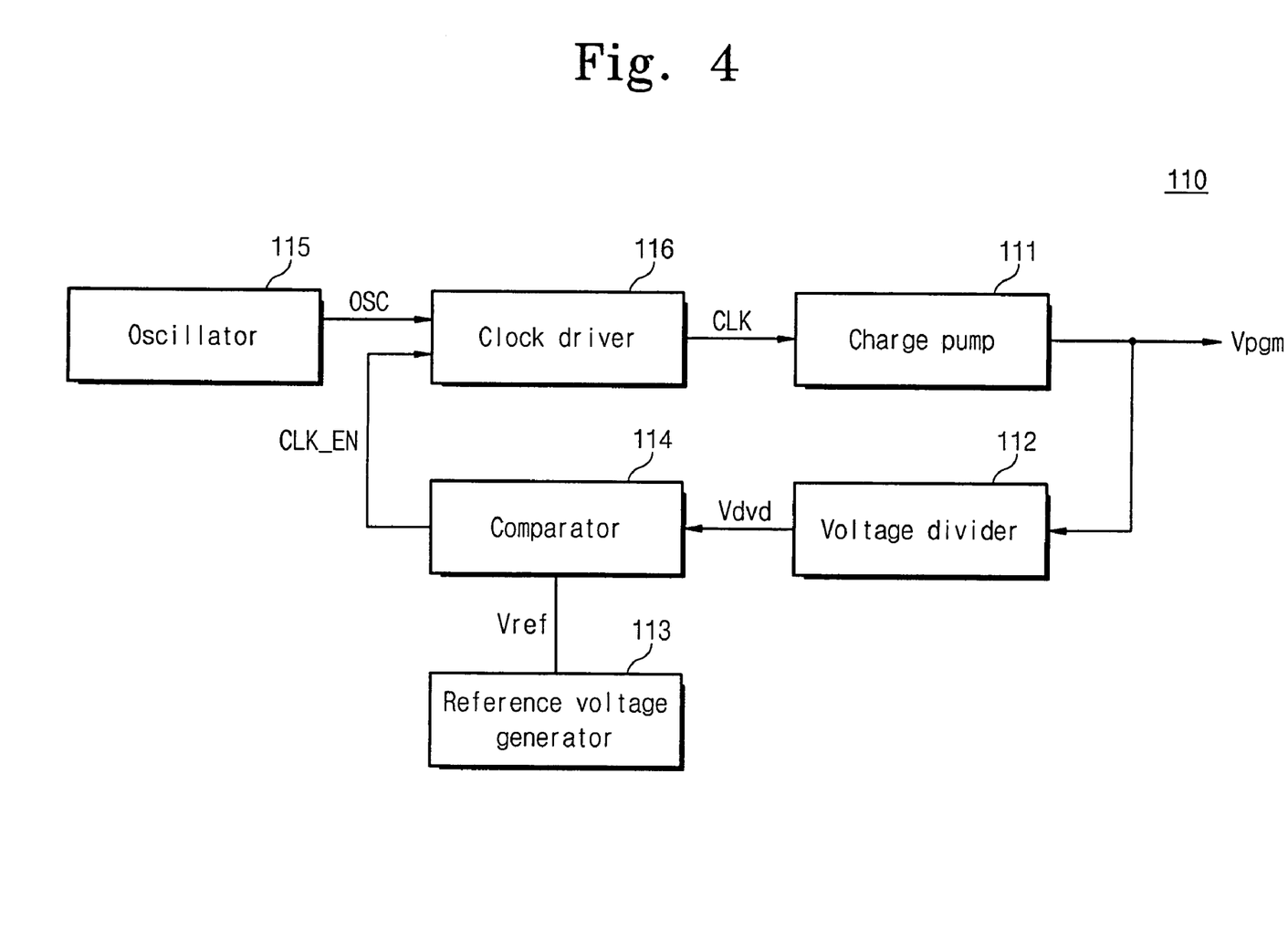
FIG. 4 is a circuit diagram of a high voltage generator circuit illustrated in FIG. 3.

As illustrated in FIG. 4, the high voltage generator circuit 110 includes a charge pump 111, a voltage divider 112, a reference voltage generator 113, a comparator 114, an oscillator 115, and a clock driver 116.

The charge pump 111 generates a high voltage Vpgm in response to a clock signal CLK. The voltage divider 112 divides the high voltage Vpgm and provides an output divide voltage Vdvd. The comparator 114 compares the divide voltage Vdvd from the voltage divider 112 with a reference voltage Vref provided by the reference voltage generator 113. The comparator 114 generates a clock enable signal CLK_EN as a result of the comparison. For example, when the divide voltage Vdvd from the voltage divider 112 is lower than the reference voltage Vref from the reference voltage generator 113, the comparator 114 activates the clock enable signal CLK_EN. The clock driver 116 outputs an oscillation signal OSC, as a clock signal CLK, in response to the clock enable signal CLK_EN. When the clock enable signal CLK_EN is activated high, the oscillation signal OSC is output as clock signal CLK. This causes the charge pump 111 to operate. When the clock enable signal CLK_EN is deactivated low, the oscillation signal OSC is cut off, which causes the charge pump 111 to stop operating.

The high voltage Vpgm generated by the high voltage generator circuit 110 may have a ripple phenomenon. The ripple phenomenon results due to additional (or unnecessary) clock signals CLK that drive the charge pump 111. The addition (or unnecessary) generation occurs because a feedback loop including voltage divider 112 and comparator 114 is used. The feedback loop is configured to control ON/OFF operation of the charge pump through the voltage divider, the comparator, and the clock driver as shown in FIG. 4. Note that the invention is aimed at not by regulating the high voltage Vpgm but by later obtaining the regulated voltage Vreg which does not have a ripple phenomenon.

Figure 5:
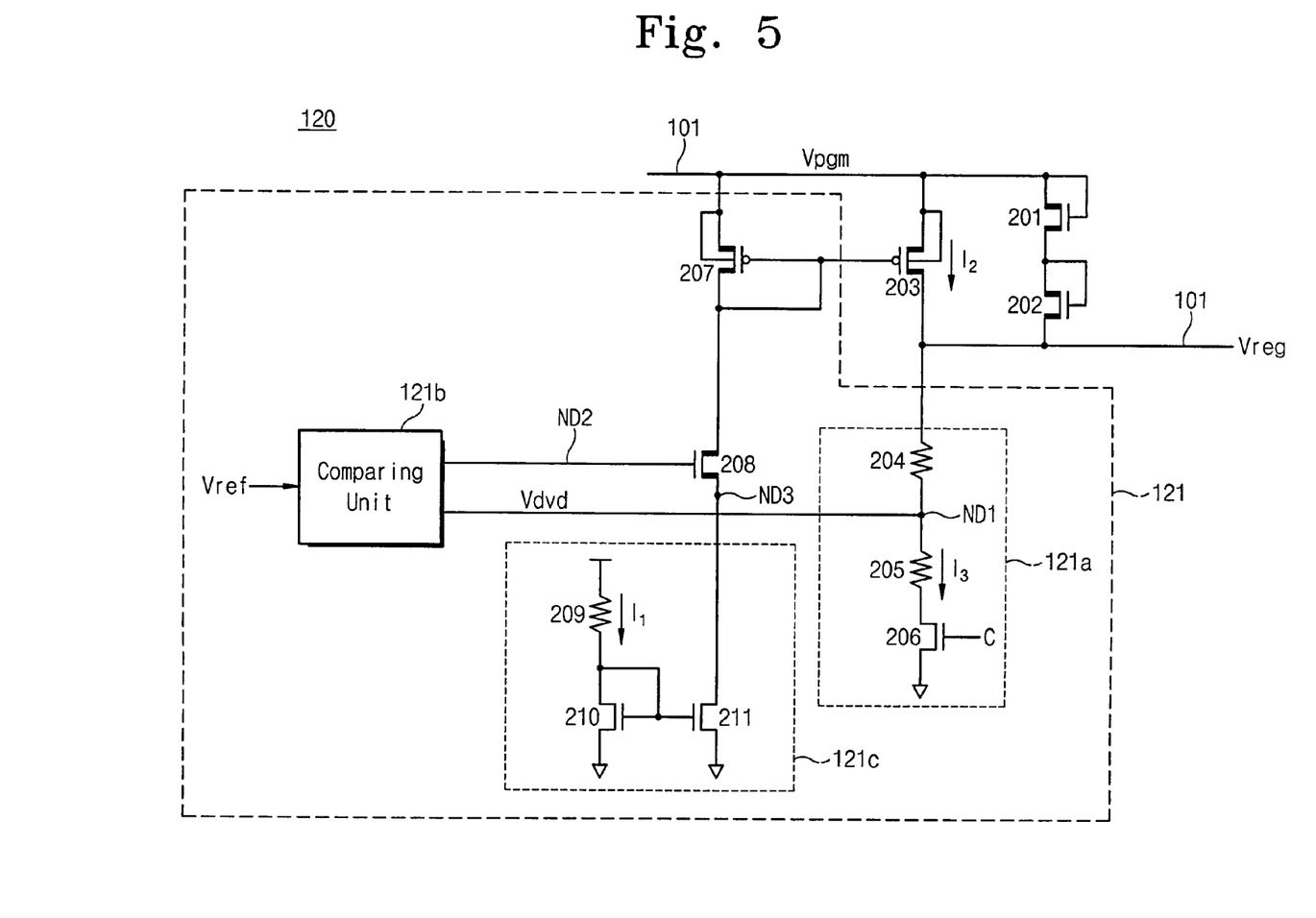
FIG. 5 is a circuit diagram of a voltage regulator circuit illustrated in FIG. 3.

As illustrated in FIG. 5, the voltage regulator circuit 120 includes NMOS transistors 201 and 202, PMOS transistor 203, and controller 121. The controller 121 includes a PMOS transistor 207, a NMOS transistor 208, a voltage dividing unit 121a, a comparing unit 121b, and a current source 121c. The PMOS transistor is connected as a current mirror.

The voltage dividing unit 121a divides a regulation voltage Vreg into output divide voltage Vdvd. The unit 121a includes resistors 204 and 205 and NMOS transistor 206. The resistor 204 is coupled between power line 102 and ND1 node (i.e., output of the voltage dividing unit). The resistor 205 and the NMOS transistor 206 are coupled between the ND1 node and ground voltage. The NMOS transistor 206 is controlled by a control signal C. The comparing unit 121b detects whether divide voltage Vdvd is lower than reference voltage Vref and it controls the current drivability of the NMOS transistor 208. The PMOS transistor 207 and the NMOS transistor 208 are serially coupled between power line 101 and the ND3 node (or the power source). A gate of the PMOS transistor 207 is connected to a drain of the NMOS transistor 208. The power source 121c is coupled to the ND3 node and it includes resistor 209 and NMOS transistors 210 and 211.

In FIG. 5, transistors 201, 202, 203, 207, and 208 are conventional high voltage transistors which are durable to a high voltage Vpgm.

Figure 6:
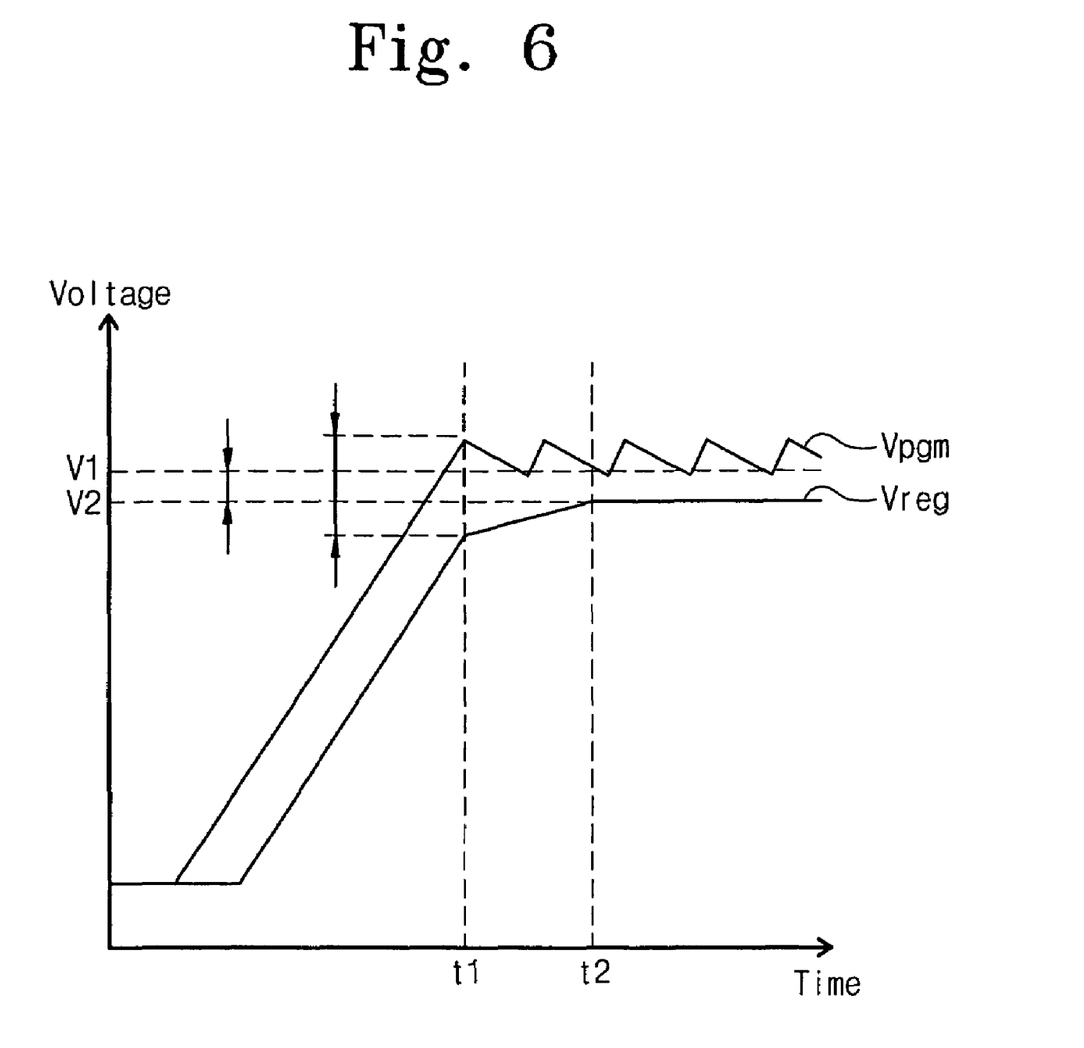
FIG. 6 illustrates the variation of a high voltage and a regulation voltage generated in an embodiment of the present invention.

FIG. 6 illustrates the variation of a high voltage Vpgm and the regulation voltage Vreg. As shown in FIG. 6, Vpgm has a ripple phenomenon whereas Vreg does not have a ripple phenomenon. It is noted that after time t2, the voltage Vreg is constant.

A semiconductor device according to the preferred embodiment described above can be used in a non-volatile memory device. The regulation voltage Vreg can be a wordline voltage (or program voltage) applied to a wordline of a memory during a program operation. The high voltage generator circuit 110 and the voltage regulator circuit 120 can constitute a wordline voltage generator circuit (or program voltage generator circuit) for generating a wordline voltage (or program voltage) Vreg. It is noted that the semiconductor device according to the present invention is not limited to the application described above.

The operation of a particular embodiment of the invention will now be described more fully with reference drawings. The circuit shown operates as follows: As a charge pump 111 starts generating a high voltage Vpgm, the high voltage Vpgm rises quickly to a target voltage V1. This is illustrated in FIG. 6. As the high voltage Vpgm rises to the target voltage V1, current is supplied to the power line 102 from a power line 101 through NMOS transistors 201 and 202. This allows the regulation voltage Vreg to rise quickly along with the high voltage Vpgm, as illustrated in FIG. 6. A difference between the regulation voltage Vreg and the high voltage Vpgm is equal to the sum of threshold voltages of the NMOS transistors 201 and 202. That is, a voltage difference between the power lines 101 and 102 is equal to the sum of threshold voltages of the NMOS transistors 201 and 202. Current is supplied to the power line 102 through a PMOS transistor 203, simultaneously with the fast rise of the regulation voltage Vreg through the NMOS transistors 201 and 202. As previously stated, a voltage difference between the power lines 101 and 102 (the sum of threshold voltages of the NMOS transistors 201 and 202) must be set to be lower than a breakdown voltage of the PMOS transistor 203.

When the high voltage Vpgm reaches the target voltage V1, the operation of the charge pump 111 pauses. However, as described above, the clock signal CLK continues to be generated from the time the high voltage Vpgm reaches a desired voltage to the time the charge pump 111 is turned off. The additional generation of clock signals CLK results in a ripple phenomenon (that is, the high voltage Vpgm is irregularly maintained), as illustrated in FIG. 6. With the present invention, the ripple phenomenon is eliminated through the voltage regulator circuit 120 and a regulation voltage Vreg is regularly maintained.

The voltage Vreg is maintained as follows: A current path generated by the NMOS transistors 201 and 202 is cut off when the difference between the high voltage Vpgm and the regulation voltage Vreg reaches a maximum of 2Vth (Vth is the threshold voltage of the respective NMOS transistors 201 and 202). This occurs at the time t1 in FIG. 6. Current is then supplied to the power line 102 from the power line 101 through the PMOS transistor 203. This causes the rise speed of the regulation voltage Vreg to be relatively slow as shown in FIG. 6. Once the high voltage Vpgm reaches a desired voltage V1, a current drivability of the NMOS transistor 208 is controlled by the comparing unit 121b. As the regulation voltage Vreg slowly rises to the desired level V2 due to the current supply of the NMOS transistor 208, the gate voltage of the NMOS transistor 208 drops gradually. This leads to decrease in current flowing through the NMOS transistor 208. Such a current decrease is continued until the regulation voltage Vreg reaches the target voltage V2. After reaching the target voltage V2, the regulation voltage Vreg is stabilized at the time current I2, charged through the PMOS transistor 203, becomes identical to leakage current I3 flowing through the voltage dividing unit 121a. That is, the regulation voltage Vreg is regularly maintained.

In an alternate embodiment of the invention, the devices are constructed for use in a non-volatile memory device such as in an ISPP (incremental step pulse programming). In an ISPP the device is used to regulate the threshold voltage distribution to dense memory cells. According to the ISPP scheme, a wordline voltage (or program voltage) gradually rises by a predetermined increase with repetition of program loops. In order to allow a wordline voltage (i.e., regulation voltage) to rise by a predetermined increase at the respective program loops, a voltage divider (112 of FIG. 4 and 121a of FIG. 5) must be constructed such that a resistor dividing rate is variable. This may be achieved by constructing voltage dividers of FIG. 4 and FIG. 5 like the trimming circuit illustrated in FIG. 1.

If the regulation voltage Vreg is generated based on a circuit architecture of FIG. 5 with a program voltage, it is possible to uniformly control the threshold voltages for programmed memory cells. If the program voltage is irregularly maintained, the program speed of the memory cells may be different from an expected result. For this reason, the regulation voltage Vreg, is regularly maintained to uniformly control the distribution of threshold voltage of memory cells.

In summary, as explained above, a voltage regulator circuit as described can be used so that a charge current can be controlled to obtain a stable (regular) voltage.

Although the present invention has been described with reference to the preferred embodiments thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

What is claimed is:

1. A semiconductor device comprising:
 a first power line and a second power line,
 a high voltage generator circuit for supplying a high voltage to said first power line;
 a current bypass circuit for supplying current to said second power line from the first power line until the voltage difference between said power lines reaches a first target value;
 a first PMOS transistor coupled between said first power line and said second power line, said PMOS transistor operating in response to a PMOS drive current; and
 a controller for controlling said PMOS drive current in response to the voltage on said second power line,
 whereby said current bypass circuit is cut off when said high voltage reaches said target first value, and current is supplied to said second power line through said PMOS transistor until the voltage on said second power line reaches a second target voltage lower than said first target voltage.

2. The semiconductor device of claim 1, wherein the current bypass circuit includes first and second NMOS transistors coupled in series between said first and second power lines to operate as a diode.

3. The semiconductor device of claim 2, wherein a voltage difference between said first and second power lines is equal to or smaller than the sum of threshold voltages of the first and second NMOS transistors.

4. The semiconductor device of claim 1, wherein a voltage difference between said first and second power lines is smaller than a breakdown voltage of the PMOS transistor.

5. The semiconductor device of claim 2, wherein said PMOS transistor and said first and second NMOS transistors are high voltage transistors.

6. The semiconductor device of claim 1, wherein after the high voltage reaches the first target voltage, the voltage of the second power line is stabilized by the current supplied through said PMOS transistor.

7. The semiconductor device of claim 1, wherein said PMOS transistor, the current bypass circuit, and the controller constitute a voltage regulator circuit for regulating the voltage on said second power line.

8. The semiconductor device of claim 1, wherein the controller comprises:
a current source;
a second PMOS transistor coupled to the first power line, the second PMOS transistor and the first PMOS transistor constituting a current mirror;
an NMOS transistor coupled between a drain of the second PMOS transistor and the current source;
a voltage dividing unit for dividing the voltage of the second power line to generate a divide voltage; and
a comparing unit for controlling a gate voltage of the NMOS transistor depending on whether the divide voltage is lower than a reference voltage.

9. A semiconductor device comprising:
a first power line;
a second power line;
a high voltage generator circuit for generating a high voltage on said first power line;
a voltage regulator circuit for regulating the voltage on said second power line;
wherein the voltage regulator circuit comprises:
a first PMOS transistor coupled between the first and second power lines; said PMOS transistor operating in response to a PMOS drive current;
a current bypass circuit for supplying current to the second power line from the first power line; and
a controller for controlling said PMOS drive current in response to the voltage on said second power line.

10. The semiconductor device of claim 9, wherein the current bypass circuit includes first and second NMOS transistors coupled in series between said first and second power lines to operate as a diode.

11. The semiconductor device of claim 10, wherein a voltage difference between said first and second power lines is equal to or smaller than the sum of threshold voltages of the first and second NMOS transistors.

12. The semiconductor device of claim 9, wherein a voltage difference between said first and second power lines is smaller than a breakdown voltage of the PMOS transistor.

13. The semiconductor device of claim 10, wherein the first PMOS transistor and the first and second NMOS transistors are high voltage transistors.

14. The semiconductor device of claim 9, wherein after the high voltage reaches a first target voltage, the voltage on the second power line is stabilized by the current supplied through said first PMOS transistor.

15. The semiconductor device of claim 9, wherein said controller comprises:
a current source;
a second PMOS transistor coupled to said first power line, the second PMOS transistor and the first PMOS transistor constituting a current mirror;
an NMOS transistor coupled between a drain of the second PMOS transistor and the current source;
a voltage dividing unit for dividing the voltage of the second power line to generate a divide voltage; and
a comparing unit for controlling a gate voltage of the NMOS transistor depending on whether the divide voltage is lower than a reference voltage.

16. The semiconductor device of claim 9, wherein current supply of the current bypass circuit is cut off when the second power line voltage reaches a first target voltage, while current supply to the second power line is conducted through the first PMOS transistor until a voltage of the second power line reaches a second target voltage lower than the first target voltage.

17. A semiconductor device comprising:
a first power line;
a second power line;
a high voltage generator circuit for outputting a high voltage to the first power line;
first and second diode-coupled NMOS transistors coupled between said first power line and said second power line;
a first PMOS transistor coupled between said first and second power lines;
a second PMOS transistor coupled said first power line, said second PMOS transistor and said first PMOS transistor constituting a current mirror, said second PMOS transistor having a drain,
a current source;
an NMOS transistor coupled between said drain of said second PMOS transistor and said current source, said NMOS transistor having a gate adapted to receive a gate voltage;
a voltage dividing unit for dividing the voltage on the second power line to generate a divide voltage; and
a comparing unit for controlling said gate voltage of said NMOS transistor depending on whether said divide voltage is lower than a reference voltage.

* * * * *

UNITED STATES PATENT AND TRADEMARK OFFICE
CERTIFICATE OF CORRECTION

PATENT NO. : 7,072,238 B2  
APPLICATION NO. : 11/025001  
DATED : July 4, 2006  
INVENTOR(S) : Dong-Hyuk Chae et al.

It is certified that error appears in the above-identified patent and that said Letters Patent is hereby corrected as shown below:

Column 6, line 49, the words "target first" should read -- first target --.

Signed and Sealed this

Eighteenth Day of August, 2009

David J. Kappos  
*Director of the United States Patent and Trademark Office*